US007233000B2

(12) United States Patent
Nassiopoulou et al.

(10) Patent No.: US 7,233,000 B2
(45) Date of Patent: Jun. 19, 2007

(54) LOW POWER SILICON THERMAL SENSORS AND MICROFLUIDIC DEVICES BASED ON THE USE OF POROUS SEALED AIR CAVITY TECHNOLOGY OR MICROCHANNEL TECHNOLOGY

(76) Inventors: Androula G. Nassiopoulou, 15310 Aghia Paraskevi, P.O. Box 60228, Athens (GR); Grigoris Kaltsas, 15310 Aghia Paraskevi, P.O. Box 60228, Athens (GR); Dimitrios N. Pagonis, 15310 Aghia Paraskevi, P.O. Box 60228, Athens (GR)

( * ) Notice: Subject to any disclaimer, the term of this patent is extended or adjusted under 35 U.S.C. 154(b) by 0 days.

(21) Appl. No.: 10/502,465

(22) PCT Filed: Jan. 16, 2003

(86) PCT No.: PCT/GR03/00003

§ 371 (c)(1),
(2), (4) Date: Jul. 23, 2004

(87) PCT Pub. No.: WO03/062134

PCT Pub. Date: Jul. 31, 2003

(65) Prior Publication Data
US 2005/0072926 A1 Apr. 7, 2005

(30) Foreign Application Priority Data
Jan. 24, 2002 (GR) .............................. 20020100037

(51) Int. Cl.
*G01J 5/20* (2006.01)
*H01L 27/14* (2006.01)
*H01L 31/0248* (2006.01)
*H01L 21/02* (2006.01)

(52) U.S. Cl. ....................... 250/338.4; 438/54; 257/467

(58) Field of Classification Search .................... None
See application file for complete search history.

(56) References Cited

U.S. PATENT DOCUMENTS 5,482,598 A * 1/1996 Isaka et al. .................. 428/409

(Continued)

FOREIGN PATENT DOCUMENTS

| CN | 1251945 | 5/2000 |
| WO | WO 98/50763 | 11/1998 |

OTHER PUBLICATIONS

Hedrich, F. et al. "Structuring of Membrane Sensors Using Sacrificial Porous Silicon." Sensors and Actuators A—Physical, vol. 84 (2000), pp. 315-323.*

(Continued)

*Primary Examiner*—David Porta
*Assistant Examiner*—Frederick F. Rosenberger
(74) *Attorney, Agent, or Firm*—Marshall, Gerstein & Borun LLP

(57) ABSTRACT

This invention provides a miniaturized silicon thermal flow sensor with improved characteristics, based on the use of two series of integrated thermocouples (6, 7) on each side of a heater (4), all integrated on a porous silicon membrane (2) on top of a cavity (3). Porous silicon (2) with the cavity (3) underneath provides very good thermal isolation for the sensor elements, so as the power needed to maintain the heater (4) at a given temperature is very low. The formation process of the porous silicon membrane (2) with the cavity (3) underneath is a two-step single electrochemical process. It is based on the fact that when the anodic current is relatively low, we are in a regime of porous silicon formation, while if this current exceeds a certain value we turn into a regime of electropolishing. The process starts at low current to form porous silicon (2) and it is then turned into electropolishing conditions to form the cavity (3) underneath. Various types of thermal sensor devices, such as flow sensors, gas sensors, IR detectors, humidity sensors and thermoelectric power generators are described using the proposed methodology. Furthermore the present invention provides a method for the formation of microfluidic channels (16) using the same technique of porous silicon (17) and cavity (16) formation.

9 Claims, 6 Drawing Sheets

U.S. PATENT DOCUMENTS

| | | | | |
|---|---|---|---|---|
| 5,565,084 | A | * | 10/1996 | Lee et al. .................... 205/646 |
| 6,139,758 | A | * | 10/2000 | Tu ................................ 216/2 |
| 6,359,276 | B1 | | 3/2002 | Tu .......................... 250/338.1 |
| 6,759,265 | B2 | * | 7/2004 | Artmann et al. .............. 438/53 |
| 6,803,637 | B2 | * | 10/2004 | Benzel et al. ................ 257/414 |
| 6,832,523 | B2 | * | 12/2004 | Benzel et al. ................. 73/763 |
| 2004/0195096 | A1 | * | 10/2004 | Tsamis et al. .............. 204/426 |

OTHER PUBLICATIONS

Sabate, N. et al. "Evaluation of Sensitive Materials for Integrated Thermal Flow Sensors." Proceedings of the IEEE Annual Conference of the Industrial Electronics Society, vol. 4 (2002), pp. 2681-2684.*

Nassiopoulos, A.G. "Local Formation and Patterning of Porous Silicon." in: Canham, L., Properties of Porous Silicon (England, Short Run Press, 1997), pp. 77-80.*

Halimaoui, A. "Porous Silicon Formation by Anodisation." in: Canham, L., Properties of Porous Silicon (England, Short Run Press, 1997), pp. 12-14.*

"Porous Silicon Bulk Micromachining for Thermally Isolated Membrane Formation", Dücsö et al., Sensors and Actuators, A 60, 1997, pp. 235-239.

"Micromachined Silicon Thermopile and Thermal Radiators Using Porous Silicon Technology", Dobrzański et al., IEE Proc.-Optoelectron, vol. 145, No. 5, Oct. 1998, pp. 307-311.

"Frontside Bulk Silicon Micromachining Using Porous-Silicon Technology", Kaltsas et al., Sensors and Actuators A 65, 1998, pp. 175-179.

"Novel C-MOS Compatible Monolithic Silicon Gas Flow Sensor with Porous Silicon Thermal Isolation", Kaltsas et al., Sensors and Actuators 76, 1999, pp. 133-138.

"Permeated Porous Silicon for Hydrocarbon Sensor Fabrication", Angelucci et al., Sensors and Actuators 74, 1999, pp. 95-99.

"Free-Standing, Mobile 3D Porous Silicon Microstructures", Lammel et al., Sensors and Actuators 85, 2000, pp. 356-360.

"Porous Silicon as an Effective Material for Thermal Isolation on Bulk Crystalline Silicon", Nassiopoulou et al., Phys. Stat. Sol. (a) 182, 2000, pp. 307-311.

"Multi-Walled Microchannels: Free-Standing Porous Silicon Membranes for Use in μTAS", Tjerkstra et al., Journal of Microelectromechanical Systems, vol. 9, No. 4, Dec. 2000, pp. 495-501.

International Search Report in PCT/GR03/00003 dated Apr. 23, 2003.

* cited by examiner

LOW POWER SILICON THERMAL SENSORS AND MICROFLUIDIC DEVICES BASED ON THE USE OF POROUS SEALED AIR CAVITY TECHNOLOGY OR MICROCHANNEL TECHNOLOGY

FIELD OF THE INVENTION

This invention relates to low power silicon thermal sensors and microfluidic devices, which use a micromachining technique to fabricate electrochemically porous silicon membranes with a cavity underneath. In the case of thermal sensors the structure used is of the closed type (porous silicon membrane on top of a cavity), while in microfluidics the same technique is used to open microchannels with a porous silicon membrane on top.

DESCRIPTION OF THE RELATED ART

Silicon thermal flow sensors are based on heat exchange between the fluid and the hot parts of the device, which are kept at relatively high temperature, of the order of 100–180° C. In silicon thermal gas sensors, this temperature has, sometimes, to exceed 400° C. In order to keep the temperature constant, the electric power on the heater has to compensate thermal losses due to conduction, convection and radiation. Losses due to conduction through the substrate on which the active elements of the device are fabricated can be minimized if this substrate is a thin membrane with a cavity underneath, instead of bulk crystalline silicon, (thermal conductivity of bulk silicon: K=145 W/m·K, thermal conductivity of air: K=2.62×10$^{-2}$ W/m·K).

Different methodologies were developed so far for the fabrication of membranes in the form of bridges, suspended over a cavity in bulk silicon. By using bulk silicon micromachining techniques, A. G. Nassiopoulou and G. Kaltsas [Patent No. OBI 1003010, Patent No. PCT/GR97/00040, published by WIPO 12 Nov. 1998] and G. Kaltsas and A. G. Nassiopoulou (Mat. Res. Soc. Symp. Proc. Vol. 459 (1997) 249, Microelectronic Engineering 35 (1997) 397) fabricated suspended polycrystalline or monocrystalline silicon membranes, using only front side optical lithography and porous silicon locally formed on bulk crystalline silicon, which is then removed in order to form a cavity under the membrane. Dusko et al. [Sensors and Actuators A, Vol. 60, (1997) 235], using a similar technique, fabricated suspended silicon nitride membranes. Both of the above techniques were used to fabricate silicon thermal sensors. A gas flow sensor was fabricated by G. Kaltsas and A. G. Nassiopoulou, Sensors and Actuators A, 76 (1999), p. 133–138 and a gas sensor by C. Ducso, M. Adam, E. Vazsonyi, I. Szabo and I. Barsony, Eurosensors XI, Warsaw, Poland, Sep. 21–24, 1997).

However, there is an important drawback in the above techniques. It is related to the fragility of the structures which makes any processing after membrane formation very difficult. An alternative method was proposed and used by A. G. Nassiopoulou and G. Kaltsas (Greek patent No 1003010) and G. Kaltsas and A. G. Nassiopoulou, ["Front-side bulk silicon micromachining using porous silicon technology", Sensors and Actuators: A, 65, (1998) p. 175–179]. It uses slightly oxidized porous silicon as a material for local thermal isolation on bulk silicon. This approach offers important advantages related to the mechanical stability of the structure and the compatibility with further silicon processing. It has been successfully used to fabricate silicon thermal gas flow sensors by G. Kaltsas and A. G. Nassiopoulou [Sensors and Actuators 76 (1999) 133, Phys. Stat. Sol. (a) 182 (2000) 307].

SUMMARY OF THE INVENTION

In the present patent we propose a methodology to improve the above technique by combining the advantages of using a cavity (better thermal isolation) with the advantages of a rigid structure. The proposed structure is composed of a cavity sealed with porous silicon and fabricated in one process step by electrochemistry. Although electrochemistry has been successfully used to manufacture non-planar free-standing porous silicon structures [G. Lammel, Ph. Renaud, "Free-standing, mobile 3-D porous silicon microstructures", Sensors and Actuators A, 85, (2000) p. 356] and buried multi-walled microchannels [R. Willem Tjerkstra, Johannes G. E. Gardeniers, John J. Kelly and Albert van den Berg. "Multi-Walled Microchannels: Free-Standing Porous Silicon Membranes for Use in μTAS", Journal of MicroElectroMechanical Systems, vol. 9, No 4, (2000) p. 495] that can be applied in the area of actuators and μTAS respectively, the specific technology is the only one which provides close-type structures composed of a planar porous silicon membrane, on top of a cavity on bulk crystalline silicon. The porous silicon membrane is perfectly aligned with the crystalline silicon surface and the cavity lies underneath. The technology can be used to provide a localised thermally isolated region for the creation of a low power silicon thermal sensor or an open microchannel with a porous silicon membrane on top for the creation of a microfluidic device. The provided thermal isolation is better than in the case of porous silicon thick films without cavity underneath.

It is an object of this invention to provide a method for the fabrication of silicon thermal sensors with improved thermal isolation, based on the use of a sealed cavity on which the active elements of the sensor are developed. The sealed cavity is fabricated on bulk silicon by a two-step electrochemical process in which in the first step porous silicon is formed locally on bulk silicon by electrochemical dissolution with an anodization current below the limit for electropolishing and in a second step the current is increased so as the process is turned to electropolishing for the fabrication of a cavity underneath the porous layer. The silicon thermal sensor devices based on the above structure combine the good isolation properties offered by suspended membranes with the advantage of having a rigid structure. In the Greek patent No. OBI 1003010, a rigid and mechanically stable structure was also proposed, based on porous silicon locally formed on bulk silicon in order to provide local thermal isolation. The present approach is an improvement of that structure, because it offers both mechanical stability by the planar structure and better thermal isolation by the cavity underneath the porous layer. The critical value of current density for electropolishing (Jps) depends on the electrochemical solution used and on the resistivity and type of the silicon substrate. The thickness of the porous layer and the depth of the cavity are adjusted by adjusting the current density and the anodization time for the specific solution used. The smoothness of the bottom surface and sidewalls of the cavity depend also on the electrochemical solution used. A schematic presentation of the above described structure is shown in FIG. 1, where (1) is the silicon substrate, and (2) is the porous silicon layer on top of the cavity (3).

It is also an object of the present invention to provide a thermal flow sensor based on the above method. This sensor is illustrated in FIG. 2. It is composed of a silicon substrate (1) on which a closed structure of a porous silicon membrane (2) with a cavity underneath (3) is formed locally by an electrochemical dissolution of silicon in an HF:ethanol solution after the appropriate deposition and patterning of a masking layer. Depending on the thickness of the porous layer and the depth of the cavity, the mask for porous silicon formation is either a resist layer, or silicon nitride or a bilayer of $SiO_2$ and polycrystalline silicon. An ohmic contact (13) has been created on the back side of the silicon substrate prior to the electrochemical process. The active elements of the sensor are composed of a heater (4) and two thermopiles (6,7) on each side of the heater. The number of thermocouples in each thermopile depends on the needed sensitivity of the device. The hot contacts of the thermocouples (5) are on porous silicon and the cold contacts (10) are on the bulk crystalline silicon substrate (1). The required interconnections (11) and metal pads (12) are formed by aluminum deposition and patterning. A passivation layer may be also deposited on top of the thermal flow sensor, consisting of an insulating layer, for example silicon oxide, or silicon nitride or polyimide. An electrical isolation layer (14) is deposited on top of the silicon substrate (1) so as to assure the electrical isolation between the sensor elements and the substrate. The thermocouple material is p-type poly/Al or n-type/p-type poly. The first case limits the temperature of operation of the device at around 400° C., while the second permits operation at temperatures up to ~900° C. The heater is composed of p-type polycrystalline silicon and it is maintained at constant power or constant temperature by using an external electronic circuit, which stabilizes the power or the temperature by providing a current feedback if the temperature changes. The device can also operate at constant current on the heater, but the use of constant power is better in the case of a high flow range. Indeed, under flow the resistor is instantly cooled down by the gas flow and this causes a slight change of its resistance, which gives a measurable effect to the thermopiles output at high flow. This effect is minimized if the resistance change is compensated by a slight change in the current, so as to keep the power consumption or the temperature on the heater constant.

It is also the object of the present patent to propose the use of the heated resistor both as heater and as a temperature sensing element. Alternatively, two resistors may be integrated on both sides of the heater for temperature sensing. In the above two cases the power supply and readout electronics are different than in the case of the two thermopiles on each side of the heater.

The thermal isolation by porous silicon with a cavity underneath, compared to the use of a single porous silicon layer in contact with the substrate offers the advantage of reducing power consumption and increasing the sensitivity of the device. Simulations carried out using MBMCAD V.4.8 package by MICROPROSM showed that the improvement depends on porous layer thickness and air cavity depth. FIG. 3 shows the effect of porous layer thickness on the temperature of the heater for a cavity of 20 μm and a heat flux of $8.57 \times 10^6$ $W/m^2$ applied on a 530 μm long polysilicon heater of width 20 μm and thickness 0.5 μm. This corresponds to a supplied power of 71 mW. For comparison, the results of a compact structure, where there is no cavity but instead a 40 μm thick porous layer is added, are shown with a star in the same figure. FIG. 4 shows the temperature on the heater for a 5 μm thick porous membrane and a cavity of variable thickness underneath. A comparison between isolation by a 40 μm compact porous silicon structure and a structure with 20 μm porous silicon membrane on 20 μm cavity is shown in FIG. 5. The heater is located at the middle of the membrane.

It is also the object of the present patent to provide a technique based on the use of the porous silicon/cavity technology for the formation of a microchannel under the active elements of the device, which may be used as a flow channel, open on its two endpoints. Such a device is shown in FIG. 6. It consists of a silicon substrate (15) on which a microfluidic channel (16) sealed with a porous silicon layer (17), is formed. The said microfluidic channel has two openings, which serve as inlet (18) and outlet (19) of a fluid. A thin silicon dioxide layer (25) is deposited on top of the channel for electrical isolation. The active elements of the thermal flow device are composed of a polysilicon heater (20) and two polysilicon resistors (21, 22) on each side of the heater. The device is used to measure the micro-flow developed into the microchannel. The heater is kept at a certain temperature and the flow measurement is based on sensing the temperature difference induced by the fluid between the two polysilicon resistors (21, 22) lying on the left and right side of the heater (20) in the upstream and downstream of the flow. The heater and resistors are connected to aluminum pads (23) through aluminum interconnects (24). A passivation layer can be deposited on top of the sensor, consisting of silicon oxide or silicon nitride or polyimide. The main advantage of this technology is that microflows can be formed and measured. This technology also offers important advantages in the case of liquid flows, since the liquid will not be in contact with the active elements of the device and so there is no need for complicated passivation schemes. It also offers advantages in gas flow measurements if the gas is corrosive.

It is also the object of the present patent to provide a thermal sensor device for gas sensing based on the use of porous silicon/cavity technology for local thermal isolation on silicon.

It is also the object of the present patent to provide a silicon thermal sensor for detection of infrared radiation, based on the use of porous silicon/cavity technology for local thermal isolation on silicon.

It is also the object of the present patent to provide a silicon thermal device for thermoelectric power generation, based on the use of porous silicon/cavity technology for local thermal isolation on silicon.

It is also the object of the present patent to provide a silicon thermal device for humidity sensing, based on the use of porous silicon/cavity technology for local thermal isolation on silicon.

DESCRIPTION OF THE PREFERRED EMBODIMENTS

Figure 1:
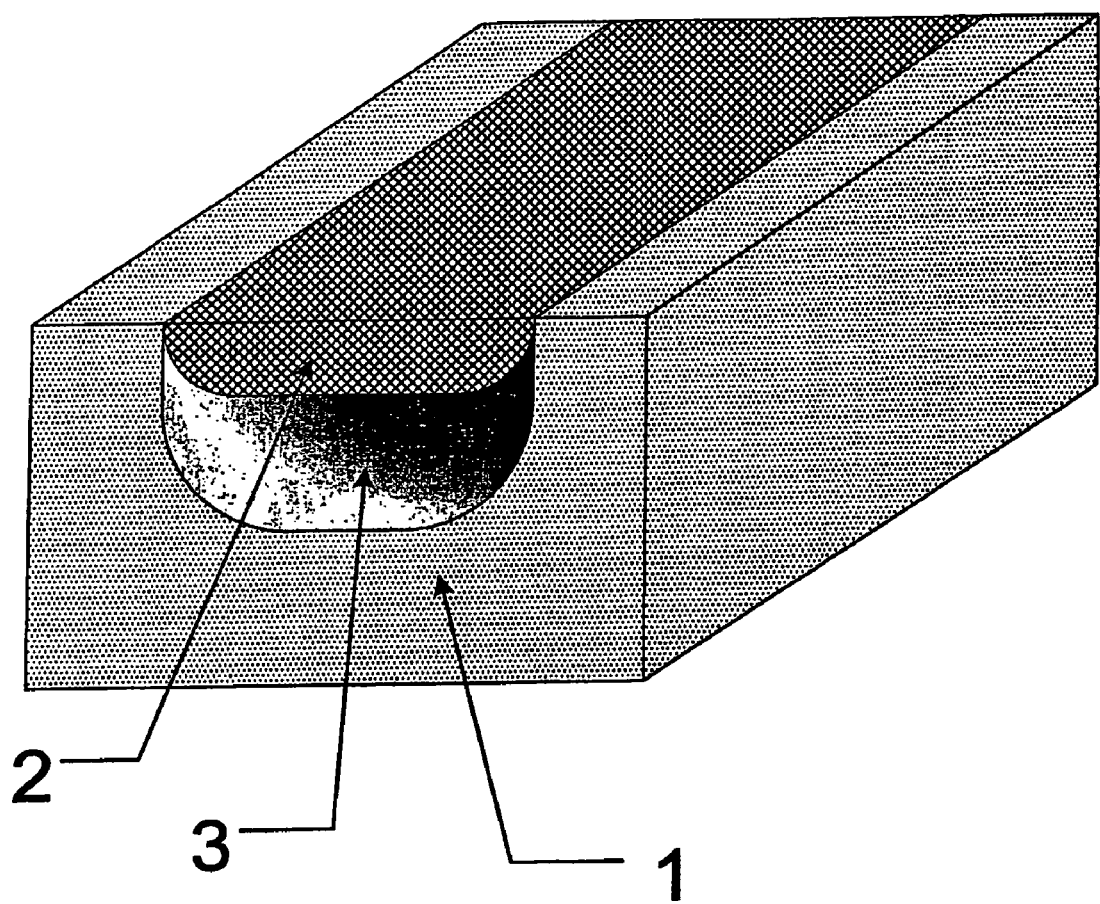
FIG. 1 is a schematic representation of the porous silicon layer over a cavity in bulk crystalline silicon.

FIG. 1 is a schematic representation of a silicon substrate (1) with a porous silicon layer (2) on top of a cavity (3). The whole structure is used for local thermal isolation on bulk silicon.

Figure 2:
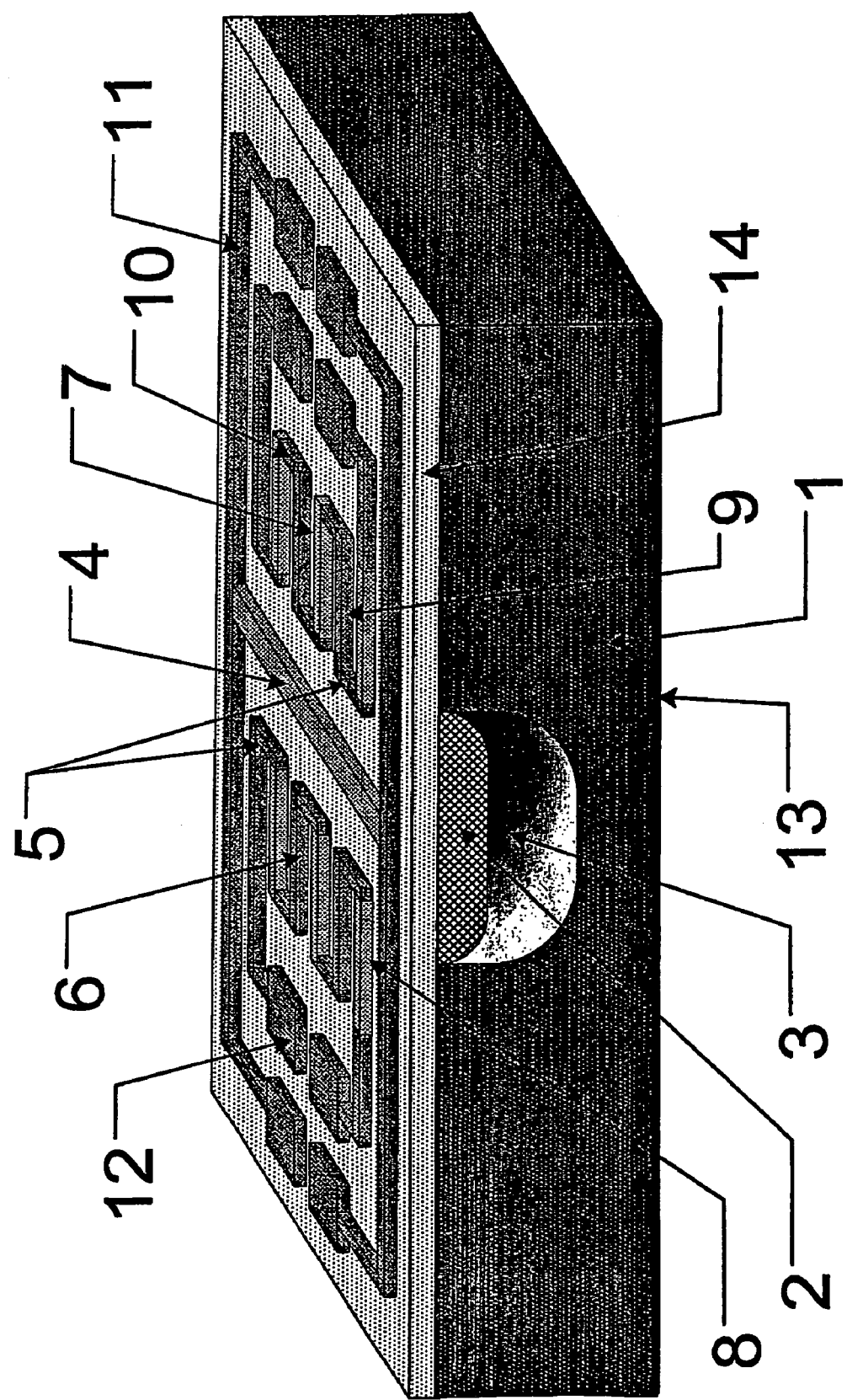
FIG. 2 shows a schematic view of a thermal sensor using porous silicon/cavity technology.

FIG. 2 is a schematic representation of a silicon thermal gas flow sensor. The base material is p-type silicon (1) in which a porous silicon membrane (2) with a cavity (3) underneath is formed.

On top of the porous silicon cavity area a polysilicon resistor (4) is formed and two series of thermocouples are integrated on each side of this resistor (6, 7). The hot contacts (5) of these thermopiles lie on porous silicon and the cold contacts (10) on bulk crystalline silicon. There are also aluminum pads (12) used as electrical contacts.

Figure 3:
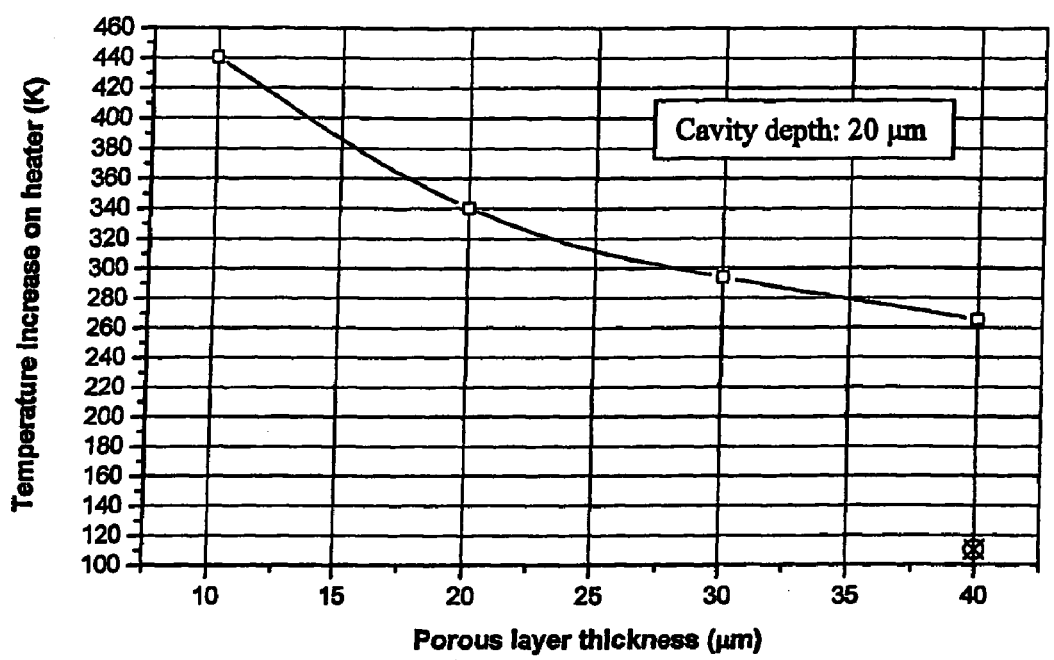
FIG. 3 shows the temperature on heater for thermal isolation by porous silicon of variable thickness over a cavity.

FIG. 3 shows the temperature on heater for thermal isolation by porous silicon of variable thickness over a cavity for a power of $8.57 \times 10^6$ W/m$^2$ applied on the heater.

Figure 4:
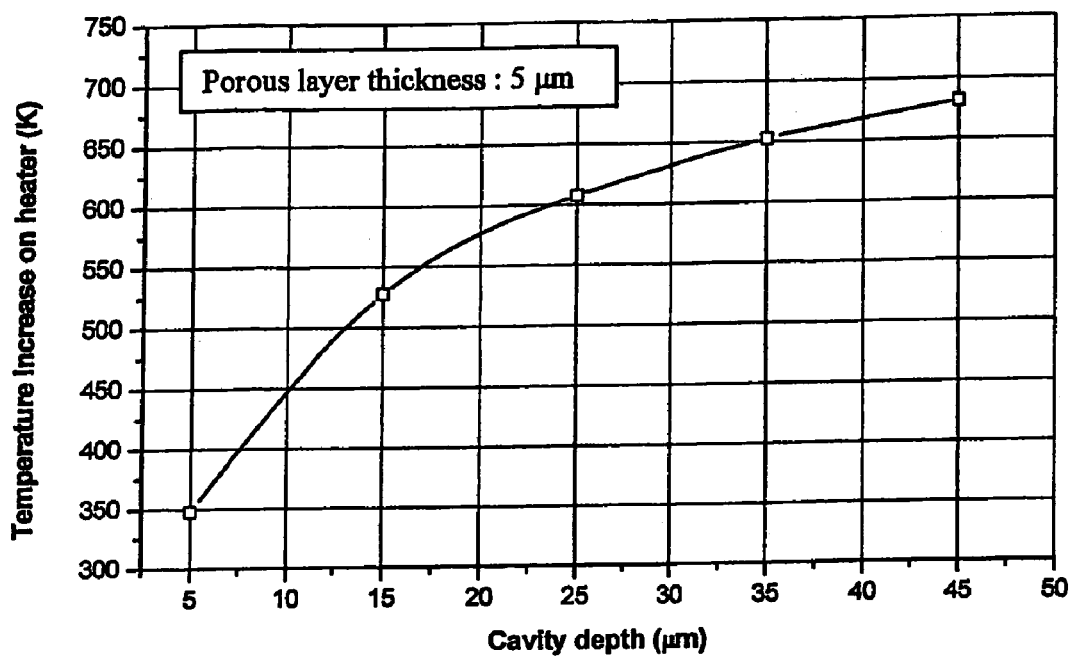
FIG. 4 shows the temperature on heater for thermal isolation by a cavity of variable depth underneath a porous silicon layer.

FIG. 4 shows the temperature on heater for thermal isolation by a cavity of variable depth underneath a porous silicon layer.

Figure 5:
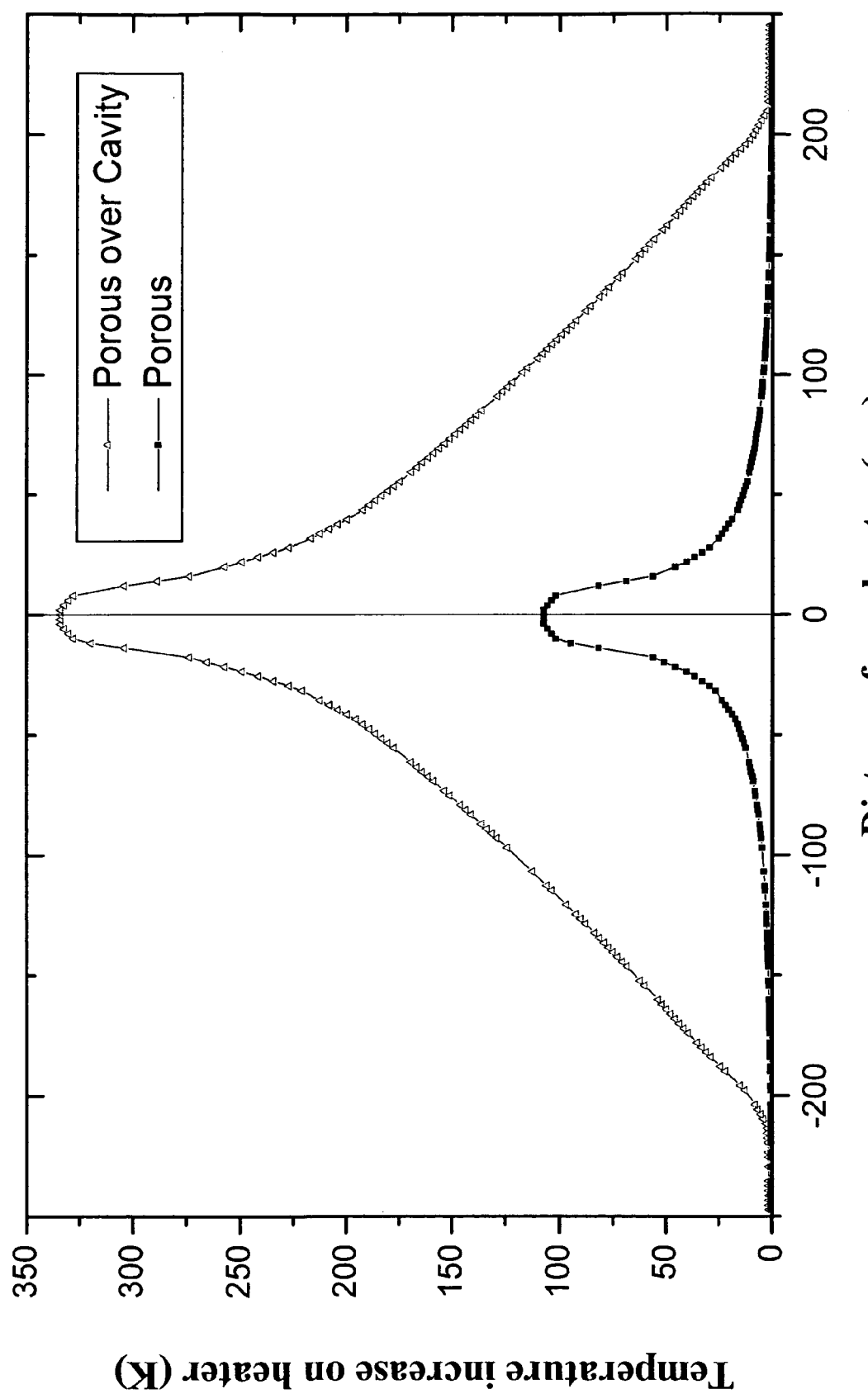
FIG. 5 shows the temperature distribution around the heater for thermal isolation by porous silicon and by porous silicon over a cavity.

FIG. 5 shows the temperature distribution around the heater for thermal isolation by 40 µm thick porous silicon film and by 20 µm thick porous silicon membrane over a 20 µm cavity.

Figure 6:
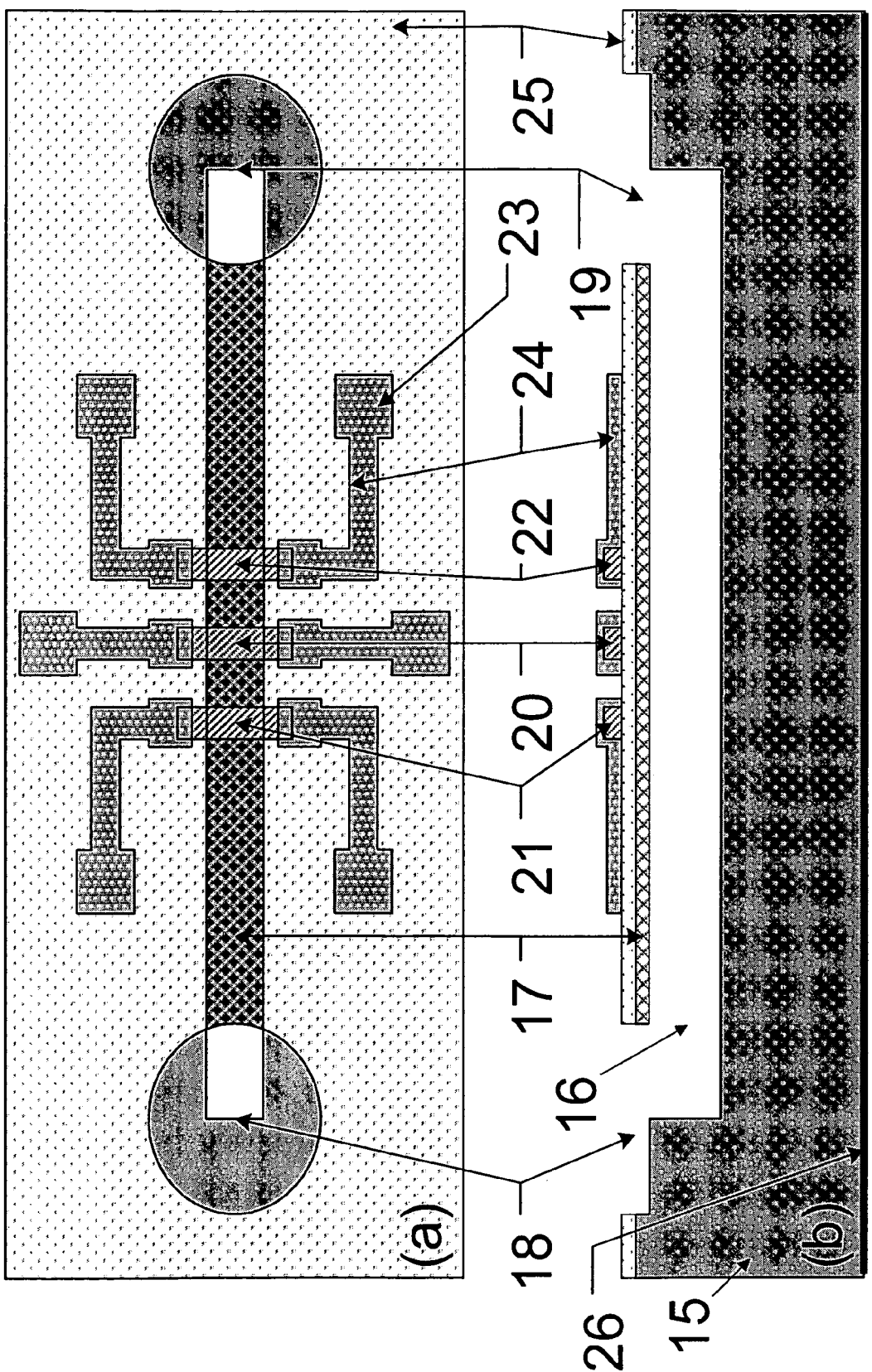
FIG. 6 is a schematic view of the flow sensor with a microchannel underneath.

FIG. 6 shows a microfluidic flow sensor based on the use of porous silicon/cavity technology. In (a) the top view and in (b) a cross sectional representation is shown, where (15) is the silicon substrate, (17) the porous silicon layer, (16) the microfluidic channel, (18, 19) the inlet and outlet of the microfluidic channel, (20) is a polycrystalline silicon resistor used as heater, (21, 22) are polycrystalline silicon resistors used as temperature sensing elements, (24) are aluminum interconnects and (23) are aluminum contact pads.

EXAMPLES

Example 1

The process used for the formation of sealed or open microfluidic channels (3)(16) on a silicon substrate (1)(15). The porous silicon capping layer is planar with the silicon substrate. The process used is a combination of electrochemical dissolution and electropolishing of silicon by using a current density below (for porous silicon formation) or above (for electropolishing) a critical value. The fabrication process is the following: an ohmic contact (26) is first formed on the back side of the said silicon substrate (1)(15), used as anode in the electrochemical dissolution of silicon in order to form locally on silicon the porous silicon layer (2)(17). On the front side of the silicon substrate a masking layer for local porous silicon formation is then deposited and patterned. The porous silicon layer (2)(17) used as capping of the microchannel (3)(16) and the microchannel are formed in one electrochemical step by first using a current density below the critical value for electropolishing, so as porous silicon is formed and by then increasing the current density above the value for electropolishing, so as to form the microchannel by dissolving silicon.

Example 2

The fabrication process of a thermal flow sensor based on the process described in Example 1. It comprises the following steps: a) Creation of an ohmic contact (13) on the back side of the said silicon substrate (1), b) deposition and patterning of a masking layer for porous silicon formation in the front side of the silicon substrate, c) porous silicon (2) formation locally on the silicon substrate using electrochemical dissolution of bulk silicon. The current density used in the electrochemical process is below the value of the current density in the electropolishing regime, d) electrochemical dissolution of silicon under the porous silicon layer, using the electropolishing conditions, i.e. a current density above a critical value, so as to form a cavity (3) below a suspended porous silicon membrane (2), e) deposition of a thin dielectric layer for electrical isolation (14), f) deposition and patterning of polycrystalline silicon, which is then doped with p-type dopants, in order to form a heater (4), lying on the porous silicon membrane and one branch of thermocouples (8), g) deposition and patterning of aluminum or n-doped polycrystalline silicon, in order to form a second branch of thermocouples (9). If the second branch of thermocouples is made of aluminum, during step (g) we also form the interconnections (11) and metal pads (12). If the second branch of thermocouples is made of n-type polysilicon, then there is an extra step of aluminum deposition and patterning, in order to form metal pads and interconnects, h) a passivation layer deposition on top of the gas flow sensor, consisting of an insulating layer, composed either of silicon oxide or silicon nitride or polyimide or other insulator.

Example 3

The fabrication process of a thermal microfluidic sensor based on the process described in Example 1. It comprises the following steps: a) creation of a microfluidic channel (16) sealed with a porous silicon layer (17) on the silicon substrate (15), b) deposition of a thin silicon dioxide layer (25) on top of the whole silicon substrate for electrical isolation, c) deposition and patterning of polycrystalline silicon in order to form a heater resistor (20) and two other resistors (21, 22) on its left and right sides, e) deposition and patterning of aluminum in order to form electrical interconnects (24) and metal pads (23) and f) opening of the inlet (18) and outlet (19) of the microchannel (16) by selectively etching locally the top silicon dioxide layer (25) and the silicon layer (15) underneath. On top of the flow sensor a passivation layer is deposited, consisting of silicon oxide or silicon nitride or polyimide.

Example 4

A thermal flow sensor fabricated with the process described in Example 2. It consists of a silicon substrate (1) with a porous silicon membrane (2) fabricated locally on the substrate, on top of a cavity (3). On top of the membrane are integrated a polysilicon resistor (4), used as heater and the so called hot contacts (5) of two series of thermocouples (6,7), each one consisting of p-type polycrystalline silicon (8) and aluminum (9) metal lines or p-type/n-type polycrystalline silicon lines. The second contact of each thermocouple, called cold contact (10), lies on bulk crystalline silicon on the said silicon substrate (1), outside of the said porous silicon membrane (2) area. There are also metal interconnects (11) and aluminum pads (12) on the said silicon substrate (1), outside the said porous silicon membrane area (2). On the back side of the said silicon substrate (1) there is an ohmic contact (13). A passivation layer may be also deposited on top of the thermal flow sensor, consisting of an insulating layer, for example silicon oxide, or silicon nitride or polyimide. An electrical isolation layer (14)

is deposited on top of the silicon substrate (1) so as to assure the electrical isolation between the sensor elements and the substrate. The thermal flow sensor is used as an active device in different sensing systems, as for example in gas flow sensing, in liquid sensing, in flow switches etc.

Example 5

A thermal microfluidic sensor fabricated with the process described in Example 3. It consists of a silicon substrate (15) on which a microfluidic channel (16) sealed with a porous silicon layer (17), is formed. The said microfluidic channel has two openings, which serve as inlet (18) and outlet (19) of a fluid. On top of the sealed microfluidic channel there is a polysilicon heater (20) and two polysilicon resistors (21, 22) on each side of the heater. The heater and resistors are connected to aluminum pads (23) through aluminum interconnects (24). On top of the gas flow sensor a passivation layer is deposited, consisting of silicon oxide or silicon nitride or polyimide. The thermal flow device is used to measure the micro-flow developed into the microchannel. The operation of such a microfluidic thermal sensor can be described as follows: The heater is set at a certain temperature; when a flow of a given fluid is present, a temperature difference between the two polysilicon resistors (21, 22) lying on the left and right side of the heater (20), i.e. in the upstream and downstream of the flow, is introduced. This difference is proportional to the flow under determination.

Example 6

The use of the silicon thermal flow sensor described in Example 4, in gas sensing. When gases with different thermal conductivities, exchange heat with the silicon thermal flow sensor, a different signal at the output of each thermopile is induced. This effect is used to distinguish the different gases in the gas flow.

Example 7

The use of the silicon thermal flow sensor described in Example 4, for applications in thermal converters. The sensor measures the true r.m.s. value of an AC signal, regardless of its waveform. This is done by comparing the AC signal with a reference DC signal, which produces the same thermal effect when supplied to the heater lying on the said porous silicon membrane.

Example 8

The use of the silicon thermal flow sensor described in Example 4, as a detector of infrared (IR) radiation. The IR radiation induces a local temperature increase on the sensor, which is measured as a voltage difference at the output of the thermopiles. The output voltage depends on the intensity of the IR radiation.

Example 9

The use of the silicon thermal flow sensor described in Example 4, as a thermoelectric power generator. The thermal power may be provided by the human skin in contact with the sensor, so as the to generate heat flow from the skin to the sensor. The operation of the thermoelectric power generator claimed can be described as follows: when there is external heat supply to the power generator, a temperature difference is developed at the thermoelectric power generator, since the thermocouples are in series.

Example 10

The use of the silicon thermal flow sensor described in Example 4, as a thermoelectric IR power generator. The IR radiation induces a local temperature increase on the sensor, which is transformed to electric power at the output of the sensor. The output power is a function of the intensity of the input IR radiation.

What is claimed is:

1. A silicon processing method, comprising:
   (a) providing a silicon substrate comprising a top side, a bottom side, and a bulk region;
   (b) forming an ohmic contact anode on the bottom side of the silicon substrate;
   (c) forming a masking layer comprising a bilayer of silicon dioxide and polycrystalline silicon on the top side of the silicon substrate and then patterning the masking layer, thereby exposing a portion of the top side of the silicon substrate;
   (d) forming a sealed microchannel by performing an electrochemical process the electrochemical process comprising:
      (i) anodizing with a first current density below the critical value for electropolishing, thereby forming a porous silicon capping layer in the exposed portion of the top side of the silicon substrate, and then
      (ii) anodizing with a second current density above the critical value for electropolishing, thereby dissolving a portion of the silicon substrate and forming a microchannel below the porous silicon capping layer;
   (e) after step (d), depositing a thin dielectric isolation layer on the top side of the silicon substrate;
   (f) performing a first deposition process, comprising:
      (i) depositing a first polysilicon layer on the thin dielectric isolation layer;
      (ii) patterning the first polysilicon layer to form a heater located above the porous silicon capping layer and a first branch of thermocouples located partially above the porous silicon capping layer and partially above the bulk region of the silicon substrate; and,
      (iii) doping the first polysilicon layer with a p-type dopant;
   (g) performing a second deposition process, comprising:
      (i) depositing an aluminum layer on the thin dielectric isolation layer; and,
      (ii) patterning the aluminum layer to form a second branch of thermocouples, interconnections, and metal pads, wherein the interconnections and the metal pads are in separate electrical contact with the heater, the first branch of thermocouples, and the second branch of thermocouples;
   (h) depositing a passivation layer above the top side of the semiconductor substrate, wherein the passivation layer is selected from the group consisting of an insulating layer, a silicon oxide layer, a silicon nitride layer, and a polyimide layer.

2. An infrared radiation detector comprising a silicon thermal sensor produced by the silicon processing method of claim 1.

3. A thermoelectric power generator comprising a silicon thermal device produced by the silicon processing method of claim 1.

4. A silicon processing method, comprising:
(a) providing a silicon substrate comprising a top side, a bottom side, and a bulk region;
(b) forming an ohmic contact anode on the bottom side of the silicon substrate;
(c) forming a masking layer comprising a bilayer of silicon dioxide and polycrystalline silicon on the top side of the silicon substrate and then patterning the masking layer, thereby exposing a portion of the top side of the silicon substrate;
(d) forming a sealed microchannel by performing an electrochemical process the electrochemical process comprising:
  (i) anodizing with a first current density below the critical value for electropolishing thereby forming a porous silicon capping layer in the exposed portion of the top side of the silicon substrate, and then
  (ii) anodizing with a second current density above the critical value for electropolishing, thereby dissolving a portion of the silicon substrate and forming a microchannel below the porous silicon capping layer;
(e) after step (d), depositing a thin dielectric isolation layer on the top side of the silicon substrate;
(f) performing a first deposition process, comprising:
  (i) depositing a first polysilicon layer on the thin dielectric isolation layer, a portion of which first polysilicon layer is located above the porous silicon capping layer;
  (ii) patterning the first polysilicon layer to form a heater located above the porous silicon capping layer and a first branch of thermocouples; and,
  (iii) doping the first polysilicon layer with a p-type dopant;
(g) performing a second deposition process, comprising:
  (i) depositing an n-doped polycrystalline silicon layer on the thin dielectric isolation layer,
  (ii) patterning the n-doped polycrystalline silicon layer to form a second branch of thermocouples;
(h) performing a third deposition process, comprising:
  (i) depositing an aluminum layer on the thin dielectric isolation layer; and,
  (ii) patterning the aluminum layer to form interconnections and metal pads, wherein the interconnections and the metal pads are in separate electrical contact with the heater, the first branch of thermocouples, and the second branch of thermocouples; and,
(i) depositing a passivation layer above the top side of the semiconductor substrate, wherein the passivation layer is selected from the group consisting of an insulating layer, a silicon oxide layer, a silicon nitride layer, and a polyimide layer.

5. An infrared radiation detector comprising a silicon thermal sensor produced by the silicon processing method of claim 4.

6. A thermoelectric power generator comprising a silicon thermal device produced by the silicon processing method of claim 4.

7. A silicon processing method, comprising:
(a) providing a silicon substrate comprising a top side, a bottom side, and a bulk region;
(b) forming an ohmic contact anode on the bottom side of the silicon substrate;
(c) forming a masking layer comprising a bilayer of silicon dioxide and polycrystalline silicon on the top side of the silicon substrate and then patterning the masking layer, thereby exposing a portion of the top side of the silicon substrate;
(d) forming a sealed microchannel by performing an electrochemical process the electrochemical process comprising:
  (i) anodizing with a first current density below the critical value for electropolishing, thereby forming a porous silicon capping layer in the exposed portion of the top side of the silicon substrate, and then
  (ii) anodizing with a second current density above the critical value for electropolishing, thereby dissolving a portion of the silicon substrate and forming a microchannel below the porous silicon capping layer;
(e) after step (d), depositing a thin dielectric isolation layer on the top side of the silicon substrate;
(f) performing a first deposition process, comprising:
  (i) depositing a first polysilicon layer on the thin dielectric isolation layer; and,
  (ii) patterning the first polysilicon layer to form a central heater, a left resistor, and a right resistor;
(g) performing a second deposition process, comprising:
  (i) depositing an aluminum layer on the thin dielectric isolation layer; and,
  (ii) patterning the aluminum layer to form interconnections and metal pads in separate electrical contact with the central heater, the left resistor, and the right resistor;
(h) selectively etching a left portion of the thin dielectric isolation layer and a left portion of the top side of the silicon substrate to form an inlet to the microchannel;
(i) selectively etching a right portion of the thin dielectric isolation layer and a right portion of the top side of the silicon substrate to form an outlet to the microchannel; and,
(j) depositing and patterning a passivation layer above the semiconductor substrate, wherein the passivation layer is selected from the group consisting of a silicon oxide layer, a silicon nitride layer, and a polyimide layer.

8. A thermal flow sensor comprising:
(a) a silicon substrate comprising a bulk region, a top side, a bottom side, a microchannel disposed therein, and a porous silicon capping layer aligned with the top side and locally formed above the microchannel;
(b) an ohmic contact anode on the bottom side of the silicon substrate;
(c) a thin dielectric isolation layer on the top side of the silicon substrate;
(d) a heater on the thin dielectric isolation layer above the porous silicon capping layer, the heater comprising a p-doped patterned polysilicon layer;
(e) a first thermocouple on the thin dielectric isolation layer, a portion of which is above the porous silicon capping layer and a portion of which is above the bulk region, the first thermocouple comprising a p-doped patterned polysilicon layer;
(f) a second thermocouple on the thin dielectric isolation layer, a portion of which is above the porous silicon capping layer and a portion of which is above the bulk region, the second thermocouple comprising a patterned aluminum layer or an n-doped patterned polysilicon layer;
(g) aluminum interconnects and aluminum pads on the thin dielectric isolation layer above the bulk region, wherein the aluminum interconnects and the aluminum pads are in separate electrical contact with the heater, the first thermocouple, and the second thermocouple; and, (h) a passivation layer above the top side of the semiconductor substrate, wherein the passivation layer is selected from the group consisting of a silicon oxide layer, a silicon nitride layer, and a polyimide layer.

9. A thermal microfluidic sensor comprising:

(a) a silicon substrate comprising a bulk region, a top side, a bottom side, a microchannel disposed therein, and a porous silicon capping layer aligned with the top side and locally formed above the microchannel;

(b) a thin dielectric isolation layer on the top side of the silicon substrate;

(c) a central polysilicon heater, a left polysilicon resistor, and a right polysilicon resistor on the thin dielectric isolation layer and above the porous silicon capping layer;

(d) aluminum interconnections and aluminum metal pads on the thin dielectric isolation layer, above the bulk region, and in separate electrical contact with the central polysilicon heater, the left polysilicon resistor, and the polysilicon right resistor;

(e) an inlet region to the microchannel through a left portion of the thin dielectric isolation layer and a left portion of the silicon substrate;

(f) an outlet region to the microchannel through a right portion of the thin dielectric isolation layer and a right portion of the silicon substrate; and, (g) a passivation layer above the top side of the semiconductor substrate, wherein the passivation layer is selected from the group consisting of a silicon oxide layer, a silicon nitride layer, and a polyimide layer.

* * * * *

UNITED STATES PATENT AND TRADEMARK OFFICE
CERTIFICATE OF CORRECTION

PATENT NO. : 7,233,000 B2 Page 1 of 1
APPLICATION NO. : 10/502465
DATED : June 19, 2007
INVENTOR(S) : Androula G. Nassiopoulou et al.

It is certified that error appears in the above-identified patent and that said Letters Patent is hereby corrected as shown below:

In the Claims:

At Column 8, line 24, "process" should be -- process, --.

At Column 9, line 12, "process" should be -- process, --.

At Column 9, line 15, "electropolishing" should be -- electropolishing, --.

Signed and Sealed this

Fourth Day of December, 2007

JON W. DUDAS
*Director of the United States Patent and Trademark Office*